(12) United States Patent
Coleman

(10) Patent No.: US 9,932,227 B2
(45) Date of Patent: Apr. 3, 2018

(54) PRODUCTION OF GRAPHENE FROM METAL ALKOXIDE

(75) Inventor: Karl Stuart Coleman, Chester-le-Street (GB)

(73) Assignee: Applied Graphene Materials UK Limited, Newcastle Upon Tyne (GB)

( * ) Notice: Subject to any disclaimer, the term of this patent is extended or adjusted under 35 U.S.C. 154(b) by 914 days.

(21) Appl. No.: 13/384,881

(22) PCT Filed: Jul. 2, 2010

(86) PCT No.: PCT/GB2010/051099
§ 371 (c)(1),
(2), (4) Date: Jan. 19, 2012

(87) PCT Pub. No.: WO2011/012874
PCT Pub. Date: Feb. 3, 2011

(65) Prior Publication Data
US 2012/0114551 A1 May 10, 2012

(30) Foreign Application Priority Data

Jul. 27, 2009 (GB) .................................. 0913011.3

(51) Int. Cl.
| | | |
|---|---|---|
| C01B 31/04 | (2006.01) |
| B05D 3/02 | (2006.01) |
| C23C 16/26 | (2006.01) |
| B82Y 40/00 | (2011.01) |
| B82Y 30/00 | (2011.01) |
| C01B 32/184 | (2017.01) |
| C01B 32/196 | (2017.01) |

(52) U.S. Cl.
CPC .............. *B82Y 40/00* (2013.01); *B82Y 30/00* (2013.01); *C01B 32/184* (2017.08); *C01B 32/196* (2017.08); *C23C 16/26* (2013.01); *C01B 2204/04* (2013.01); *C01B 2204/22* (2013.01)

(58) Field of Classification Search
CPC ....................................................... C01B 31/04
USPC ....................................................... 423/448
See application file for complete search history.

(56) References Cited

U.S. PATENT DOCUMENTS

| | | | | |
|---|---|---|---|---|
| 2006/0073275 | A1* | 4/2006 | Maruyama et al. | 427/248.1 |
| 2007/0172409 | A1* | 7/2007 | Hikata | 423/447.3 |
| 2007/0298168 | A1* | 12/2007 | Ajayan et al. | 427/249.1 |

(Continued)

FOREIGN PATENT DOCUMENTS

| | | | |
|---|---|---|---|
| WO | 2009/029984 A1 | 3/2009 | |
| WO | WO 2009/029984 | * 3/2009 | C01B 31/02 |

OTHER PUBLICATIONS

Huang, et al., Patterned Growth and Contact Transfer of Well-Aligned Carbon Nanotube Films, J. Phys. Chem. B 1999; 103: 4223-4227.*

(Continued)

*Primary Examiner* — Daniel C McCracken
(74) *Attorney, Agent, or Firm* — Quarles & Brady LLP

(57) ABSTRACT

A process for producing grapheme is disclosed. The process comprises introducing a solution (102) of a metal alkoxide in a solvent into a decomposition apparatus, wherein the decomposition apparatus includes a first region having a sufficiently high temperature to cause thermal decomposition of the metal alkoxide, to produce graphene.

37 Claims, 10 Drawing Sheets

(56) References Cited

U.S. PATENT DOCUMENTS

2008/0089828 A1* 4/2008 Soga et al. ............... 423/447.2

OTHER PUBLICATIONS

Vivekchand, et al., Carbon nanotubes by nebulized spray pyrolysis, Chemical Physics Letters 2004; 386: 313-318 (2004).*

Goknur Cambaz, et al., Noncatalytic synthesis of carbon nanotubes, graphene and graphite on SiC, Carbon 2008; 46: 841-849.*

Peigney, et al., A Study of the Formation of Single- and Double-Walled Carbon Nanotubes by a CVD Method, J. Phys. chem. B. 2001; 105: 9699-9710.*

International Search Report dated Dec. 6, 2010 in connection with PCT/GB2010/051099.

Choucair M., et al.: Gram-scale Production of Graphene Based on Solvothermal Synthesis and Sonication; Natur Enanotechnology, vol. 4, Dec. 7, 2008; pp. 30-33; XP002610932.

Avouris, P., Chen, Z.H. and Perebeinos, V., Nature Nanotech., 2007, 2, 605-615.

Geim, A.K. and MacDonald, A.H., Physics Today, 2007, 60, 35-41.

Eda, G., Fanchini, G. and Chhowalla, M., Nature Nanotech., 2008, 3, 270-274.

Lee, C., Wei, X.D., Kysar, J.W. and Hone, J., Science, 2008, 321, 385-388.

Fowler, J.D., Allen, M.J., Tung, V.C., Yang, Y., Kaner, R.B. and Weiller, B.H., ACS Nano, 2009, 3, 301-306.

Bunch, J.S., van der Zande, A.M., Verbridge, S.S., Frank, I.W., Tanenbaum, D.M., Parpia, J.M., Craighead, H.G. and McEuen, P.L., Science, 2007, 315, 490-493.

Hummers, W.S. and Offeman, R.E., J. Am. Chem. Soc., 1958, 80, 1339-1339.

McAllister, M.J., Li, J.L., Adamson, D.H., Schniepp, H.C., Abdala, A.A., Liu, J., Herrera-Alonso, M., Milius, D.L., Car, R., Prud'homme, R.K. and Aksay, I.A., Chem. Mater., 2007, 19, 4396-4404.

Schniepp, H.C., Li, J.L., McAllister, M.J., Sai, H., Herrera-Alonso, M., Adamson, D.H., Prud'homme, R.K., Car, R., Saville, D.A. and Aksay, I.A., J. Phys. Chem. B, 2006, 110, 8535-8539.

Li, J.L., Kudin, K.N., McAllister, M.J., Prud'homme, R.K., Aksay, I.A. and Car, R., Phys. Rev. Lett., 2006, 96, 176101.

Stankovich, S., Dikin, D.A., Piner, R.D., Kohlhaas, K.A., Kleinhammes, A., Jia, Y., Wu, Y., Nguyen, S.T. and Ruoff, R. S., Carbon, 2007, 45, 1558-1565.

Subrahmanyam, K.S., Vivekchand, S.R.C., Govindaraj, A. and Rao, C.N.R., J. Mater. Chem., 2008, 18, 1517-1523.

Park, S. and Ruoff, R.S., Nat Nano, 2009, 4, 217-224.

Bourlinos, A.B., Steriotis, T.A., Zboril, R., Georgakilas, V. and Stubos, A., J. Mater. Sci., 2009, 44, 1407-1411.

Somani, P.R., Somani, S.P. and Umeno, M., Chem. Phys. Lett., 2006, 430, 56-59.

Emstev, K.V., Bostwick, A., Horn, K., Jobst, J., Kellogg, G.L., Ley, L., McChesney, J.L., Ohta, T., Reshanov, S.A., Rohrl, J., Rotenberg, E., Schmid, A.K., Waldmann, D., Weber, H.B. and Seyller, T., Nat. Mater., 2009, 8, 203-207.

Dato, A, Radmilovic, V., Lee, Z.H., Phillips, J. and Frenklach, M., Nano Lett., 2008, 8, 2012-2016.

Kosynkin, D.V., Higginbotham, A.L., Sinitskii, A., Lomeda, J.R., Dimiev, A., Price, B.K. and Tour, J.M., Nature, 2009, 458, 872-876.

Jiao, L., Zhang, L., Wang, X., Diankov, G. and Dai, H., Nature, 2009, 458, 877-880.

* cited by examiner

PRODUCTION OF GRAPHENE FROM METAL ALKOXIDE

CROSS-REFERENCE TO RELATED APPLICATIONS

This application claims priority to PCT International Application No. PCT/GB2010/051099 filed on Jul. 2, 2010, which claims priority to Great Britain Application No. 0913011.3 filed on Jul. 27, 2009, both of which are fully incorporated by reference herein.

FIELD OF THE INVENTION

The present invention relates to methods of production of graphene. In particular, but not exclusively, the invention relates to a method of production of graphene using a chemical vapour deposition technique. Graphene may be produced according to this process as a powder or a film.

TECHNICAL BACKGROUND

Graphene is the name given to a two dimensional (2D) monolayer of carbon atoms, in which the atoms are bonded to each other in a 2D hexagonal lattice structure. Graphene can be considered to be the basic building block of various other forms of carbon: graphite consists of layers of graphene stacked to form a three dimensional (3D) material, carbon nanotubes are commonly described as rolled-up sheets of graphene, and fullerenes are nanometer-sized balls of graphene.

Carbon nanostructures have been proposed for use in many different applications, particularly in nanotechnology and materials science. Carbon nanotubes and fullerenes have been used for various applications, but their electric, magnetic and elastic properties all originate from the parent structure. However, graphene has yet to receive the attention that has been thrust upon both nanotubes and fullerenes, due to the problem of making it in bulk quantities for realistic applications. Both fullerenes and carbon nanotubes can be grown by a number of different methods that can be utilized for continuous synthesis. However, existing methods for creating graphene are not viable for industrial or mass production.

Much has been made of the properties of this material, especially its electronic properties. Electrons in graphene behave like relativistic particles that have no rest mass and travel at $10^6$ meters per second. This value is 300 times slower than the speed of light in a vacuum but is much faster than electrons travelling in an ordinary conducting material. Graphene exhibits a room temperature quantum Hall effect, and an ambipolar electric field effect, as well as the ballistic conduction of charge carriers. Graphene is a material suggested as a solution to the problem of transistors based on a silicon oxide gate. Unlike all other known materials, graphene remains highly stable and conductive even when it is cut into devices one nanometer wide. Graphene transistors begin to show advantages and good performance at thicknesses below 10 nanometers—the miniaturization limit at which current silicon technology is expected to fail. A graphene layer has also been demonstrated as a conducting transparent electrode in a device.

Mechanical investigations into the structure of graphene sheets using an AFM tip gave a Young's modulus of 0.5 TPa (200 times stronger than steel on a nanoscale level). This high value suggests that graphene has a high strength and rigidity giving it application in the field of nanoelectromechanical systems (NEMS) such as pressure sensors and resonators, as well as application to fillers in nanocomposites.

Many of the early investigations into graphene and its properties were conducted on samples that had been mechanically cleaved from bulk graphite, often using adhesive tapes or micromechanical cleavage. This process is difficult to scale up, and suffers from the problem that the small amounts of graphene produced are hidden in large quantities of thin graphite flakes. Alternatively, oxidation of bulk graphite to graphene oxide interrupts the interactions between the layers allowing them to separate when dispersed in a solvent. Like the oxidation of carbon nanotubes, the process has a detrimental effect on the properties by introducing large defects into the structure. To regain the graphene structure, an extra step such as thermal annealing in an inert atmosphere or reduction using hydrazine is required. Disruption of the layers of graphite to produce graphene can also be achieved using liquid phase exfoliation using solvents and surfactants, but again suffers from poor yields and the need to use large volumes of solvent or surfactant.

More recent research has been focused on synthetic production of graphene from other carbon sources. Graphene has been synthesized by pyrolysis of betaine and camphor (over nickel metal), silicon carbide reduction and ethanol via microwave irradiation. The decomposition of hydrocarbons over metal substrate has also been known to produce some graphene. Also recently, carbon nanotubes have been reported as a source of graphene by selective oxidation or "longitudinal cutting" of the cylindrical wall with potassium permanganate and sulphuric acid or ionized argon gas. However, each of these methods suffer from some common drawbacks: (i) low yield and synthesis of other carbon morphologies during the procedure, which limits extensive studies and development on the material; (ii) the thickness of the material that is produced is rarely below 10 nanometers; and (iii) they often require a sophisticated apparatus (microwave and high pressure reactors), controlled atmosphere, high temperature (silicon carbide reduction requires 1500-2000 degrees Celsius), time-consuming steps, transition metal catalysts, or highly flammable and potentially explosive gaseous mixtures.

Commercial production of graphene for the global market is currently based on the micromechanical cleaved and oxygen intercalation methods, both of which are time consuming, with the latter still containing a large amount oxidized graphene with inferior electrical and mechanical properties. The high production costs involved are reflected in the high market price.

WO 2009/029984 A1 describes a process for producing graphene wherein an alkali metal is reacted with an alcohol to produce a solvothermal product comprising a metal alkoxide. The solvothermal product is then pyrolysed to produce the graphene. A drawback of this process is that the reaction to form the solvothermal product, on which the process relies, is a lengthy process, taking about 72 hours. Furthermore, both the production of the solvothermal product and the pyrolysis step are necessarily performed as a batch process. As a result, the process is not well-suited to industrial-scale manufacture. Equally, formation of the solvothermal product generates high pressures in excess of 100 bar and the addition of sodium metal to a small amount of alcohol is a very exothermic reaction generating a lot of heat and the explosive gas hydrogen. As the pyrolysis step requires the presence of oxygen, the graphene produced may be oxidised to graphene oxide, again lowering the yield of graphene.

STATEMENTS OF INVENTION

According to a first aspect of the invention, there is provided a process for producing graphene, comprising the step of:

introducing a solution of a metal alkoxide in a solvent into a decomposition apparatus, wherein the decomposition apparatus includes a first region having a sufficiently high temperature to cause thermal decomposition of the metal alkoxide, to produce graphene.

Advantageously, this process produces a high yield of graphene compared with prior art methods, and can be implemented as a continuous process. Another advantage is that the process can be implemented using available spray injection chemical vapour deposition technology, and is scalable for research-scale or industrial-scale production of graphene. Another advantage is that the process can be used to produce both films and powders of graphene. Yet another advantage of the process is that the graphene produced is easily isolated, since the metal carbonate and the metal hydroxide byproducts are water-soluble. Yet another advantage of the process is that the carbon obtained by thermal decomposition of the alkoxide is substantially all graphene. Yet another advantage is that the process offers an inexpensive method for graphene production, since the reagents used are readily available and inexpensive, and the process itself is relatively quick and simple. Furthermore, no heavy metal catalyst is required, which could be expensive and would require further treatment of the graphene to remove the catalyst.

Preferably, the solvent comprises an alcohol.

Preferably the alkyl group of the alcohol is the same as the alkyl group of the metal alkoxide.

The alcohol may comprise ethanol, and the metal alkoxide may comprise a metal ethoxide.

The metal alkoxide may comprise a sodium alkoxide.

The process may further comprise the step of vaporising the solution.

The step of introducing the solution may include creating droplets of the metal alkoxide solution.

The droplets may comprise a spray or mist or aerosol of the metal alkoxide solution.

The droplets may be created in, or introduced to, a flow of gas.

Preferably the gas is inert.

The process may further comprise the step of flowing the gas through the first region.

This provides the advantage that the gas flow carries the droplets into and/or through the first region.

The process may further comprise the step of flowing the gas through a second region, cooler than the first region, for collecting graphene.

Advantageously, this step enables the graphene to be collected continuously.

Graphene powder may be produced.

The process may further comprise the step of growing a film of graphene on a substrate.

Advantageously, this enables graphene to be produced in the configuration required for creating electronic components. In previous work in which graphene has been grown on a substrate, the substrate is a metal catalyst that is essential to the growth of graphene. However, the present invention does not rely on any particular composition of the substrate for graphene growth. Indeed, the substrate may comprise any material, provided that it is capable of withstanding the conditions used during the process. For example, the substrate may comprise a metal, in particular a non-catalytically active metal such as gold, silver, or steel. The substrate may comprise a high-temperature plastic.

The substrate may comprise at least one of: silicon, silicon oxide, glass and/or silicon carbide.

Advantageously, the present invention enables a graphene film to be grown directly onto a substrate suitable for producing electronics components.

The process may further comprise the step of controlling the duration of growth of the film.

Advantageously, controlling the duration of growth of the film enables the thickness of the film to be selected.

The first region may be held at a temperature above the decomposition point temperature of the metal alkoxide.

The first region may be held at a temperature in the range 300 to 1800 degrees Celsius.

The process may include a chemical vapour deposition process.

Advantageously, the process can be carried out using existing set-ups, as it shares similar technology to that used for production of other carbon nanostructures such as carbon nanotubes.

Preferably, the process is operated substantially continuously.

The process may further comprise the step of washing the graphene with water to remove other products of the thermal decomposition step.

The process may further comprise the step of annealing the graphene.

The step of annealing the graphene may be performed at a temperature between 400 and 3000 degrees Celsius.

The metal alkoxide solution may be obtained by a method other than a solvothermal process.

Advantageously, this significantly reduces the cost and time required to produce graphene.

The metal alkoxide solution may be obtained using at least one of the following steps:
adding the metal to an alcohol;
adding a metal hydroxide to an alcohol; and/or
adding a metal carbonate to an alcohol.

Advantageously, each of these methods produce a solution of the metal alkoxide, and it is not necessary to isolate the metal alkoxide. A particular advantage in obtaining a metal alkoxide solution by adding a metal carbonate to an alcohol or adding a metal hydroxide to an alcohol, particularly if large quantities of solution are to be produced, is that they do not require using sodium which is very reactive and can therefore be dangerous, and is difficult to store safely.

Advantageously, metal alkoxides are industrially produced is this manner, and are therefore readily available and inexpensive. In contrast to a prior method for graphene production, it is not necessary to produce the metal alkoxide by means of a lengthy and expensive solvothermal process.

According to a second aspect of the invention, there is provided a process for producing graphene, comprising the step of:

introducing at least a first reagent and a second reagent into a first region of a decomposition apparatus, wherein said first and second reagents react to produce a metal alkoxide; and said first region has a sufficiently high temperature to cause thermal decomposition of the metal alkoxide to produce graphene.

Advantageously, producing a metal alkoxide for decomposition to graphene in situ enables the method to be carried out in a continuous manner. In particular, the formation of the metal alkoxide and its thermal decomposition to graphene can be carried out simultaneously in the same apparatus.

The first reagent may comprise at least one of: a metal, a metal carbonate, and/or a metal hydroxide; and said second reagent may comprise an alcohol.

The metal may comprise sodium.

The alcohol may comprise ethanol.

The first reagent may be replenished intermittently.

Advantageously, this enables the process to be carried out substantially continuously, particularly in the case in which the first reagent is a solid.

The second reagent may be introduced as droplets into the decomposition apparatus.

Advantageously, this allows the second reagent to be introduced continuously into the decomposition apparatus.

The droplets may comprise a mist, spray or aerosol.

The droplets may be created in, or introduced to, a flow of gas.

The process may comprise the step of flowing a gas through the first region.

Advantageously, the flow of gas provides a means for carrying the second reagent to the location of the first reagent.

The gas may be inert.

The first reagent may be held in a boat.

The advantage of this feature is that the graphene forms in the boat, thereby facilitating collection of the graphene. In order to continue the production of graphene, a boat containing graphene may be replaced intermittently, by a boat containing the first reagent. Alternately, boats containing the first reagent may be cycled through the first region of the decomposition apparatus.

Graphene powder may be produced.

The first region may be held at a temperature in the range 300 to 1800 degrees Celsius.

The process may be operated substantially continuously.

The process may further comprise the step of washing the graphene with water to remove other products of the thermal decomposition step.

The process may further comprise the step of annealing the graphene.

The step of annealing the graphene may be performed at a temperature between 400 and 3000 degrees Celsius.

BRIEF DESCRIPTION OF THE DRAWINGS

A preferred embodiment of the present invention will now be described, by way of example only and not in any limitative sense, with reference to the accompanying drawing, in which:

FIG. 13a shows an atomic force microscopy (AFM) image of graphene powder deposited from solution onto a freshly cleaved mica surface;

FIGS. 13b and c show height cross-sections of the image of FIG. 13a, along the lines indicated by the black arrows in FIG. 13a;

DETAILED DESCRIPTION OF EMBODIMENTS

Figure 1:
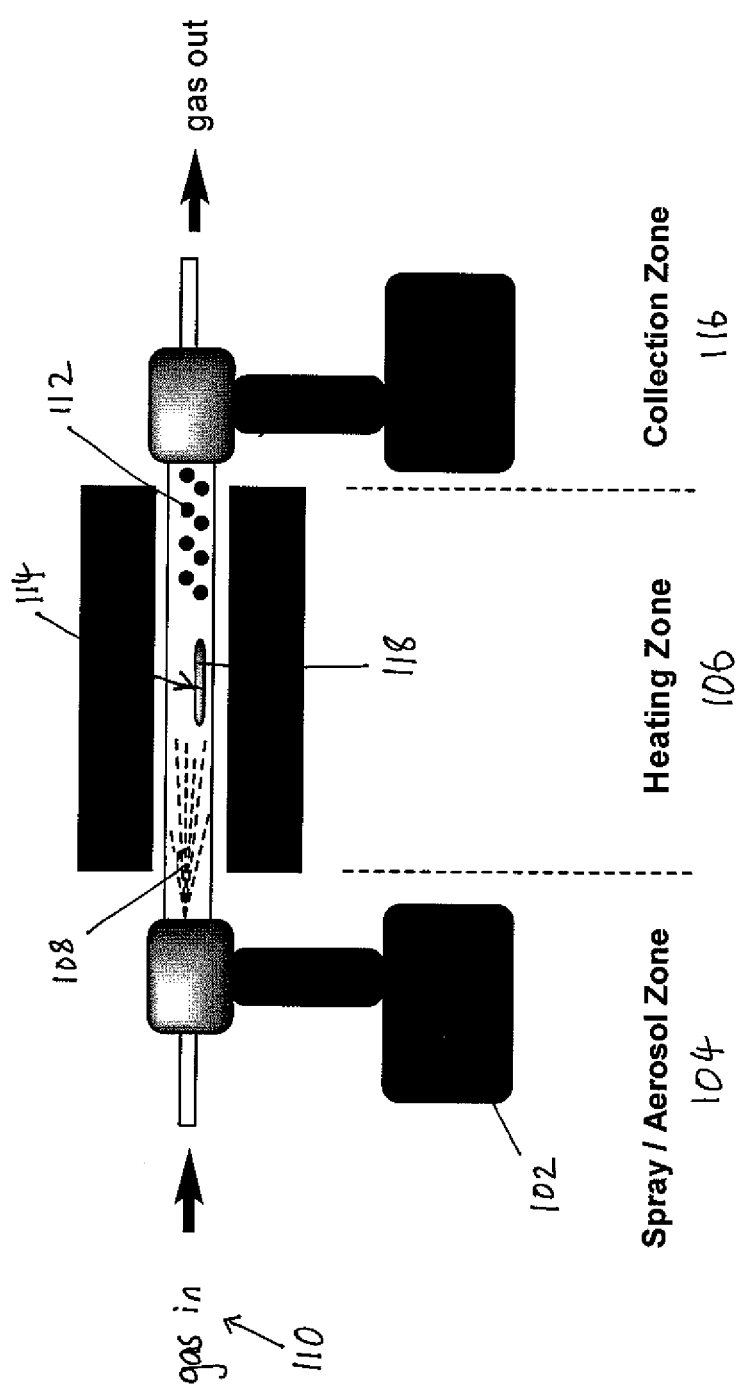
FIG. 1 illustrates a process for production of graphene according to a first embodiment of the present invention.

FIG. 1 schematically illustrates a process for producing graphene according to a first embodiment of the present invention. A solution 102 of a metal alkoxide is provided in a spray/aerosol zone 104. Droplets of the solution 102 are introduced into a heating zone 106 as a fine spray, mist or aerosol 108. In a preferred embodiment, the droplets 108 are carried into the heating zone 106 by means of a carrier gas 110. In the heating zone 106, the metal alkoxide thermally decomposes to form graphene 112, 114. The graphene may form as a powder 112 which may be collected in a cooler collection zone 116. The graphene may also form as a thin film 114 on a substrate 118 placed in the heating zone 106.

Figure 2:
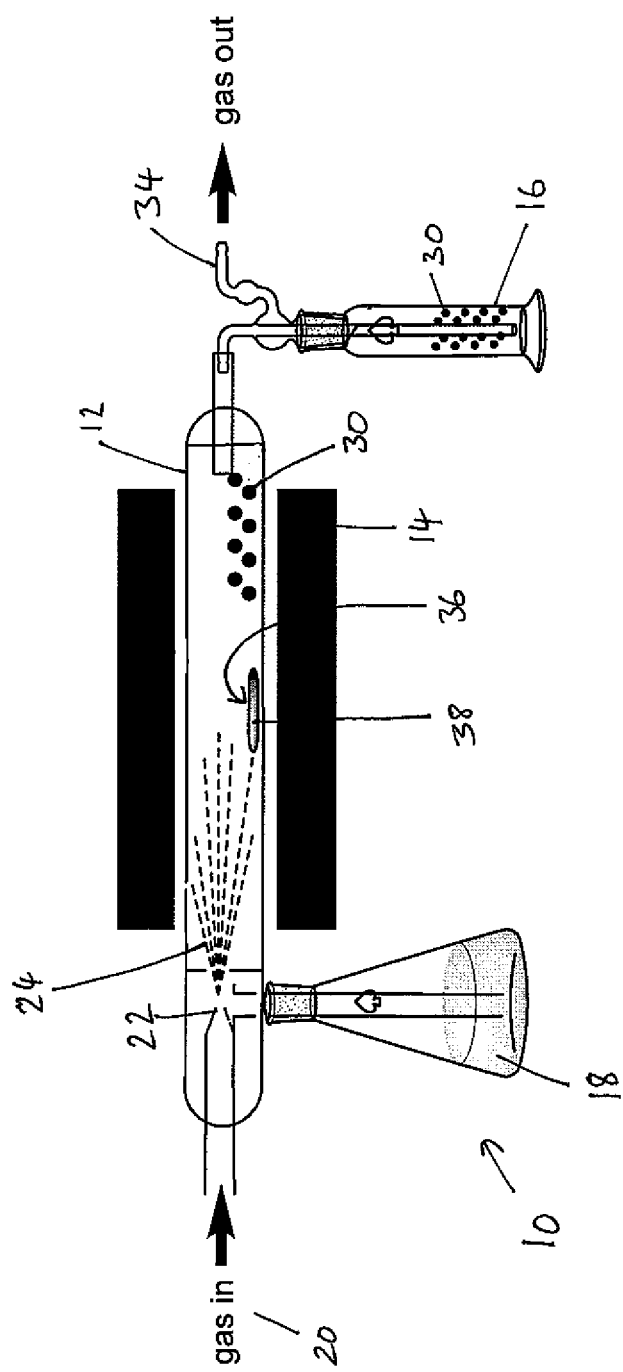
FIG. 2 shows an apparatus suitable for producing graphene according to the method of the present invention.

FIG. 2 shows an apparatus suitable for producing graphene according to the method of the present invention. The apparatus includes a sprayer 10, a quartz furnace tube 12 heated inside a furnace 14, and a collection vessel 16. The sprayer 10 contains a metal alkoxide solution 18, preferably a solution of a metal alkoxide in an alcohol. The sprayer 10 is connected to a supply of gas 20, preferably an inert gas such as argon, which is passed through the sprayer 10 and nozzle 22 to create a spray or a fine mist or aerosol 24 of the metal alkoxide solution. The flow of gas carries the droplets 24 of metal alkoxide solution through the heated quartz furnace tube 12, such that the metal alkoxide thermally decomposes to form graphene.

The graphene may form as a powder 30, which deposits on the cooler parts of the furnace tube 12. Graphene powder may also be collected in the collection vessel 16, as shown in FIG. 2. The graphene powder falls under its own weight to the bottom of the collection vessel 16, whereas the gas is exhausted through the outlet 34 of the collection vessel. Alternatively, or in addition, graphene films 36 may be produced, on the walls of the furnace tube 12, and/or on a substrate 38 located in a hot region of the furnace.

The process may continue for as long as the metal alkoxide solution is available. In this way, the process can be operated as a continuous, or quasi-continuous, process.

With continued reference to FIG. 2, an example of a process for producing graphene using a solution of sodium ethoxide ($NaOCH_2CH_3$) in ethanol ($CH_3CH_2OH$) will be described.

Step 1—Preparation of Metal Alkoxide Solution

Sodium ethoxide ($NaOCH_2CH_3$) may be obtained, for example, by (a) the addition of sodium (Na) to ethanol ($CH_3CH_2OH$) or (b) the addition of sodium hydroxide (NaOH) to ethanol or (c) addition of sodium carbonate ($Na_2CO_3$) to ethanol. Alternatively, commercially available sodium ethoxide may be used, as purchased.

When method (a) is used, the sodium ethoxide ($NaOCH_2CH_3$) may be left in solution in the ethanol. Typical concentrations used vary between about 0.5 M (0.57 g of Na in 50 ml of ethanol) and 1.7 M (1.95 g Na in 50 ml of ethanol).

For method (b), similar concentrations have been used: i.e. from about 0.5 M (1.0 g of NaOH in 50 ml of ethanol) to about 1.7 M (3.4 g of NaOH in 50 ml of ethanol). In this reaction the sodium hydroxide (NaOH) is added to ethanol at 60° C., and the reaction is complete when all the NaOH dissolves, usually within in a few minutes. Water is a byproduct of the reaction and can be removed by the addition of 3 A molecular sieves and the solution filtered to remove the sieves. However, it is not essential to remove the water.

For method (c), sodium carbonate ($Na_2CO_3$) is reacted with ethanol at reflux temperatures, and water can be removed by the addition of 3 A molecular sieves but it is not essential. Starting from 2 g of $Na_2CO_3$ and 100 ml of ethanol, 0.1 g of sodium ethoxide ($NaOCH_2CH_3$) is produced after 12 hours. Again, typical concentrations range from about 0.5 M to about 1.7 M.

In addition, as-purchased sodium ethoxide ($NaOCH_2CH_3$) solution (in ethanol) at the concentrations described above, works just as well.

The concentrations of sodium ethoxide ($NaOCH_2CH_3$) given above are by way of example only, and can be higher or lower than the values described. However, the saturation concentration (therefore the maximum) of sodium ethoxide in ethanol is achieved at 21 weight % which is approximately 3 MThe concentration of the sodium ethoxide solution used is varied according to the desired application. For example, when graphene films are to be produced, a relatively low concentration of sodium ethoxide is used (e.g. 0.5 M), whereas when graphene powder is to be produced, a relatively high concentration is used (e.g. 1.7 M).

Step 2—Heating the Furnace Tube

After the solution 18 is prepared, it is added to the sprayer 10, which is then connected to the furnace tube 12 that sits inside the furnace 14. In this embodiment, the sprayer 10 has a volume of approximately 1 liter, and the furnace tube 12 is a quartz tube 12 having a length of 900 mm and a diameter of 28 mm. However, the furnace tube 12 may have any length and diameter, and may be made of any material, provided that it can withstand the temperature and alkaline/basic conditions of the process. An inert gas 20 is then flowed through the system (that is, through the sprayer 10, furnace tube 12, and collection vessel 16) at 70 ml/min. The inert gas may be argon, although any inert gas may be used. At this flow rate (70 ml/min), no spraying occurs. During this time the furnace 14 is heated to 900 degrees Celsius at a rate of 20 degrees Celsius per minute and then held at this temperature for the duration of the process. The temperature of the furnace 14 only needs to be higher than the decomposition point of the metal alkoxide, which is 300 degrees Celsius in the case of sodium ethoxide ($NaOCH_2CH_3$) and 350 degrees Celsius in the case of sodium methoxide ($NaOCH_3$). A higher temperature may be used. In this embodiment, any higher temperature which practical for a tube furnace may be used, e.g. up to about 1800 degrees Celsius.

Step 3—Graphene Production

When the furnace 14 has reached the required temperature, a spray/fine mist/aerosol 24 of sodium ethoxide ($NaOCH_2CH_3$) in ethanol is generated by increasing the flow rate of the inert gas 20 through the sprayer 10 to a flow rate of 170 ml/min. The flow rate may be adjusted to above or below this value stated. However, if the flow rate is too low no spray will be generated, and if it is too high the spray will pass rapidly through the furnace tube 12 with only minimal reaction. If the flow rate is too high, a jet of liquid may be produced, rather than a spray. The minimum flow rate required to produce a spray depends on the actual sprayer used, in particular the nozzle size of the sprayer.

The mist/spray/aerosol 24 generated at the nozzle 22 of the sprayer 10 is carried through the furnace tube 12, which is held at 900 degrees Celsius (see above). In a typical experiment we would spray approximately 40 ml of a 1.7 M solution of sodium ethoxide ($NaOCH_2CH_3$) in ethanol into the furnace tube 12. With an argon gas flow rate of 170 ml/min, this would take approximately 20-30 mins.

The sodium ethoxide solution 18 sprayed into the hot furnace tube 12 undergoes thermal decomposition to produce graphene powder 30 and graphene films 36. In the apparatus of the present embodiment, the uniform hot zone of the furnace 14 extends approximately 10 cm either side of the centre. Outside this region there is likely to be a small temperature gradient. Graphene powder 30 deposits on the cooler parts of the quartz furnace tube 12 and can be collected in a vessel 16 connected to the opposite end of the furnace tube 12 from the sprayer unit 12, as shown in FIG. 2. The yield of carbon is approximately. 5-10%, based on mass of sodium ethoxide ($NaOCH_2CH_3$). However, it is difficult to determine the yield accurately, as sometimes not all of the graphene is recovered as it can be stuck to the walls of the furnace tube 12.

Alternatively, or at the same time, graphene films 36 are produced on the walls of the furnace tube 12. A graphene film 36 may be produced on a substrate 38 placed in the hot zone of the furnace tube 12. Any substrate may be used, provided that it is capable of withstanding the temperature of the furnace. For example, graphene films 36 have been grown on substrates 38 comprising silicon (Si) or silicon oxide ($SiO_2$) placed in the hot zone of the furnace tube 12. Alternatively, the substrate may comprise a metal, in particular a non-catalytically active metal such as gold, silver, or steel, or may comprise a high-temperature plastic or glass.

To produce a graphene film 36, the same conditions as described above may be used, except that relatively low concentrations of sodium ethoxide are used (for example, 0.5 M solutions or lower), and/or the spraying time is reduced (for example, to a few minutes). The flow rate of the inert gas 20 can also be varied to control the amount of sodium ethoxide solution delivered to the hot zone of the furnace tube 12. The thickness of the film 36 can be controlled by controlling the spraying time, with longer spraying times producing thicker films. A film thickness of 350 nm on a $SiO_2$ surface was obtained using a 1.7 M solution of sodium ethoxide in ethanol, sprayed into a furnace at 900 degrees Celsius for 20 mins, using an argon flow rate of 170 ml/min. Thinner films (ca. 20-30 nm) on Si were grown using 0.5 M solution sprayed into a furnace at 900 degrees Celsius for 6 mins, at an argon flow rate of 170 ml/min.

Step 4—Collection and Purification of Graphene

After spraying is stopped the furnace tube 12 is cooled to room temperature in flowing argon (at a flow rate of 70 ml/min) before opening it up to the atmosphere.

The products 30, 36 are collected from the walls of the furnace tube 12 and from the collection vessel 16, and then purified from the sodium carbonate ($NaCO_3$) and sodium hydroxide (NaOH) which are also formed in the reaction. This may be achieved by sonicating the black solid product in water (for example, using 10 mg of solid per 5 ml of water), followed by acidification of the resulting solution using hydrochloric acid (HCl at a concentration of M) until a pH of 1.0 is reached. The suspension is then centrifuged (at 11,000 rpm, 15557 g) for 20 minutes, the supernatant decanted and replaced with high purity water, and the suspension sonicated and centrifuged once again. This process is repeated until the supernatant was pH neutral. The graphene solid was finally isolated by filtration over a nylon membrane having a 0.2 micron pore size). The graphene solid can be further annealed at high temperatures 400-3000 degrees Celsius for several hours to improve crystallinity.

Analytical Data

Figure 3:
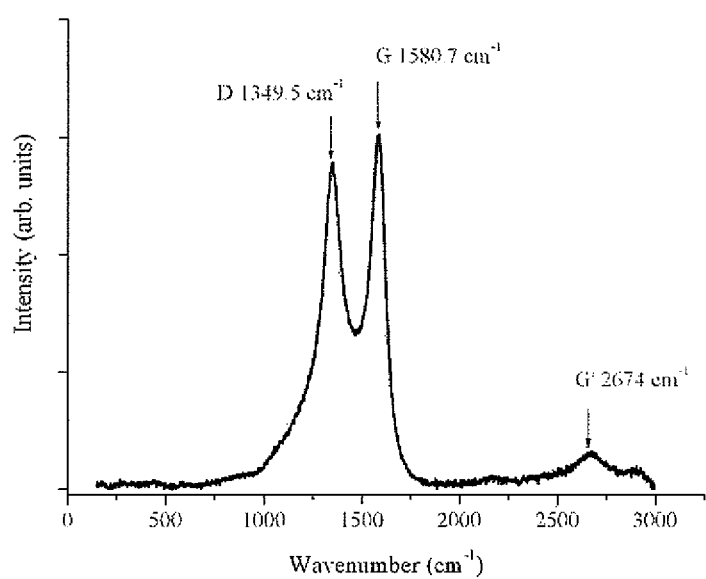
FIG. 3 shows a Raman spectrum (excitation at 632.8 nm) of graphene powder obtained using the method according to the present invention, prior to purification of the graphene.

FIG. 3 shows the Raman spectrum of as-produced graphene. The as-produced material shows the characteristic G (graphitic carbon) band peak at ca. 1580 $cm^{-1}$ corresponding to values previously reported for graphene. The G' band was observed at 2674 $cm^{-1}$. The presence of a D band at ca. 1350 $cm^{-1}$ could suggest the presence of some defects, or simply the excitation of the numerous edges of the graphene particles likely to be present in the area of the material sampled.

Figure 4:
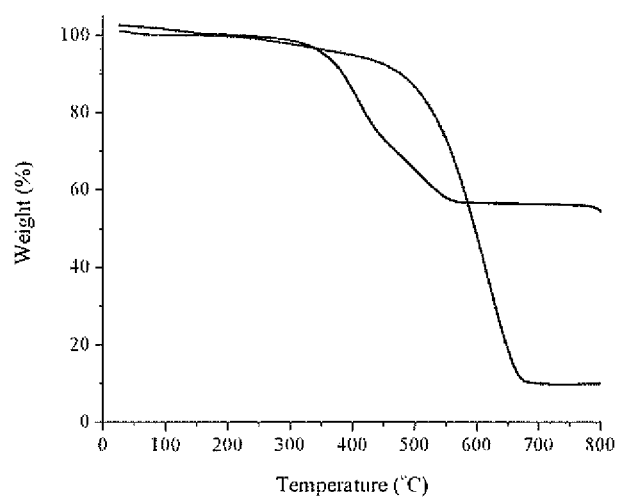
FIG. 4 shows a percentage weight thermogravimetric analysis (TGA) of graphene powder obtained using the method according to the present invention, prior to purification (black line) and after purification (grey line)

FIG. 4 shows the results of thermogravimetric analysis (TGA) in air of the as-produced graphene solid recovered from the furnace. The TGA analysis showed that the as-produced graphene solid had a weight residual of 55% at 700 degrees Celsius. This residual is reduced to 8% at 700 degrees Celsius after purification using the process described above.

Figure 5:
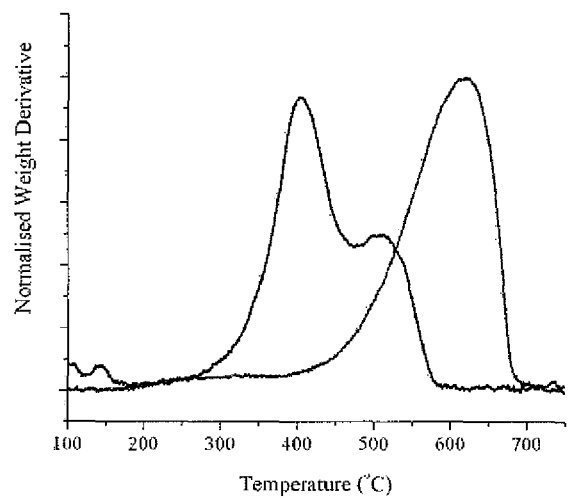
FIG. 5 shows a normalised weight derivative of the TGA data of FIG. 4, for graphene powder prior to purification (black line) and after purification (grey line)

The degradation temperature of the material also increases from ca. 400 degrees Celsius for the as-produced graphene powder, to 620 degrees Celsius for the purified graphene, which is a degradation temperature expected for graphene, as can be seen in FIG. 5.

Figure 6:
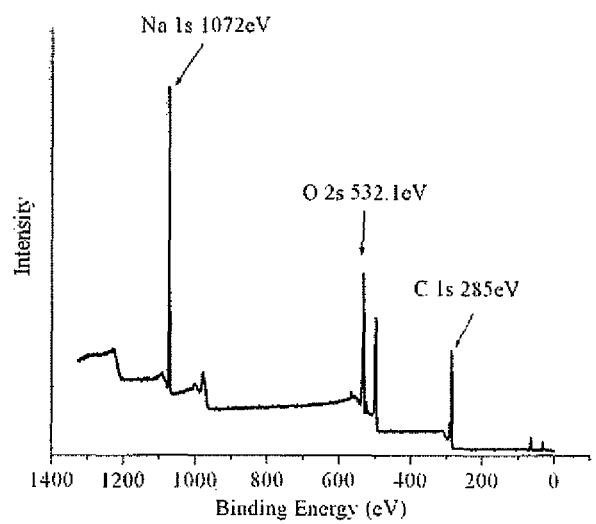
FIG. 6 shows an X-ray photoelectron spectroscopy (XPS) survey scan of graphene powder obtained using the method according to the present invention, prior to purification.
Figure 7:
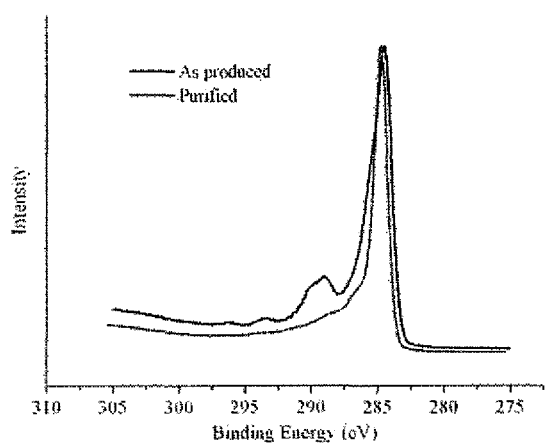
FIG. 7 shows an enlargement of the scan of FIG. 6 in the region of the C 1s peak.

FIG. 6 shows the results of X-ray photoelectron spectroscopy (XPS) of the as-produced solid, confirming the by-products present in the as-produced material to be predominately sodium salts, having 15 at % sodium content (Na 1s peak at 1072 eV). On close inspection of the carbon peak, shown in FIG. 7, we observe the characteristic C 1s peak for graphitic carbon at 284.6 eV and a peak at 289.4 eV (characteristic of carbonate salts). XPS also showed the effectiveness of the purification step, showing a vastly reduced sodium content (0.97 at %) and the disappearance of the carbonate peak in the C 1s region. Similarly, the data indicates the formation of graphene as opposed to graphene oxide or highly disordered graphene as there are no significant shoulders (characteristic of C—O or C=O groups) present on the graphitic carbon peak at 284.6 eV in FIG. 7.

Figure 8:
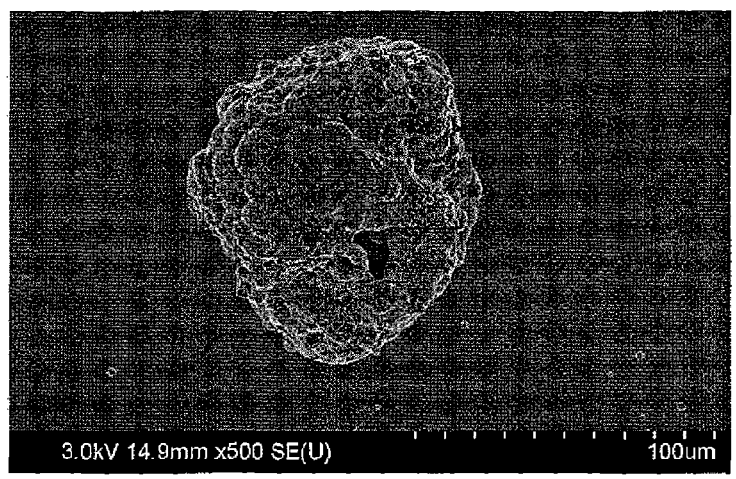
FIG. 8 shows a scanning electron microscopy (SEM) image of a particle from the graphene powder prior to purification.
Figure 9:
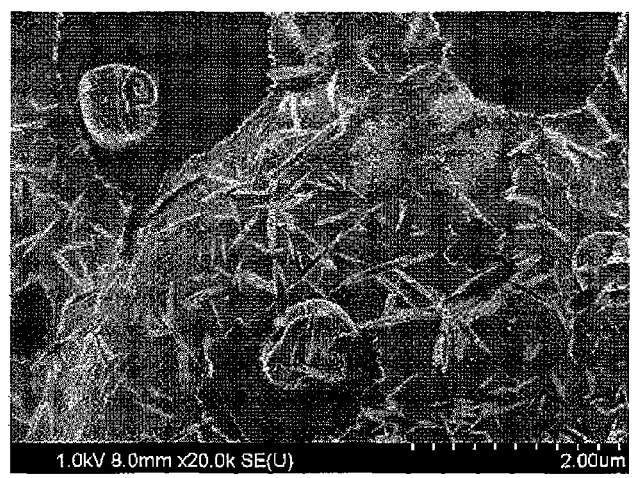
FIG. 9 shows a magnified SEM image of the particle shown in FIG. 8.
Figure 10:
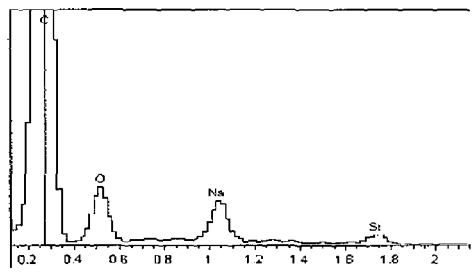
FIG. 10 shows an energy dispersive x-ray (EDX) spectrum of the particle shown in FIG. 8.

By using scanning electron microscopy (SEM) we were able to investigate the structure of the as-produced powder material removed from the furnace. FIG. 8 shows an SEM image of a particle from the as-produced graphene powder. Various particle sizes could be defined ranging from 1 to 100 microns. By increasing the magnification of the particle shown in FIG. 8, small bundled structures were observed on the surface and embedded in the particle, as can be seen in FIG. 9. These bundles had an apparent sheet-like structure, suggesting that they were agglomerates of graphene possibly encased within large particles of the metal salts. Energy dispersive X-ray (EDX) spectroscopy showed these structures to be made up of mainly carbon with small amounts of sodium and oxygen present, as shown in FIG. 10.

Figure 11:
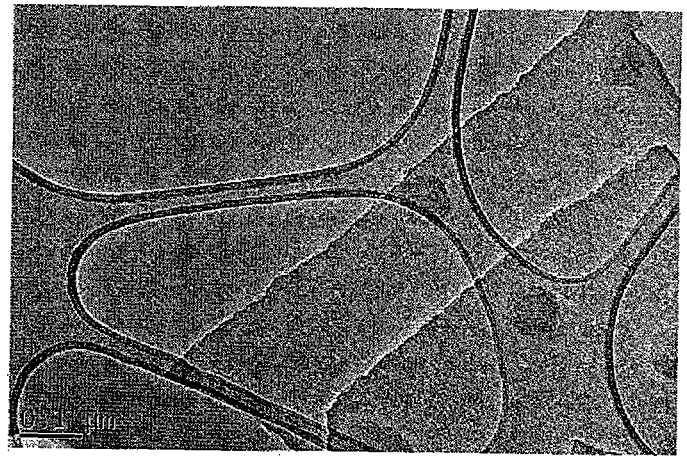
FIG. 11 shows a transmission electron microscopy (TEM) image of the purified graphene powder, obtained according to the process of the present invention, deposited on a lacey carbon coated 300 mesh copper grid.
Figure 12:
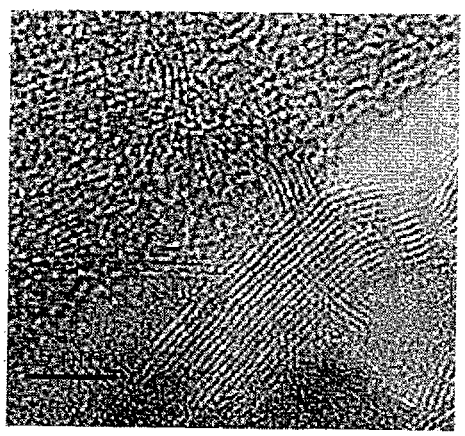
FIG. 12 shows a high-resolution TEM image of a dense region of graphene deposited on a lacey carbon coated 300 mesh copper grid, with the edges parallel to the electron beam.

Transmission Electron Microscopy (TEM) was used to further investigate the graphene structure. By depositing a dilute solution of the purified material on a lacey carbon coated 300 mesh copper grid, the sheet like structure of the graphene is clearly visible, as in FIG. 11. Importantly, no other nanocarbon structures, such as scrolls, ribbons, fibres, nanotubes or graphite, were observed. The image displayed in FIG. 11 shows one sheet of graphene sitting on top of a second sheet. The sheets varied in dimensions but were typically a few microns in size. FIG. 12 shows a high resolution TEM image of a region that was densely packed with graphene, with the edges parallel to the electron beam. It shows areas where few-layer graphene is present and the separation between the layers of approximately 0.35 nm is clearly visible, providing good evidence for the production of well-ordered and crystalline graphene.

Figure 13:
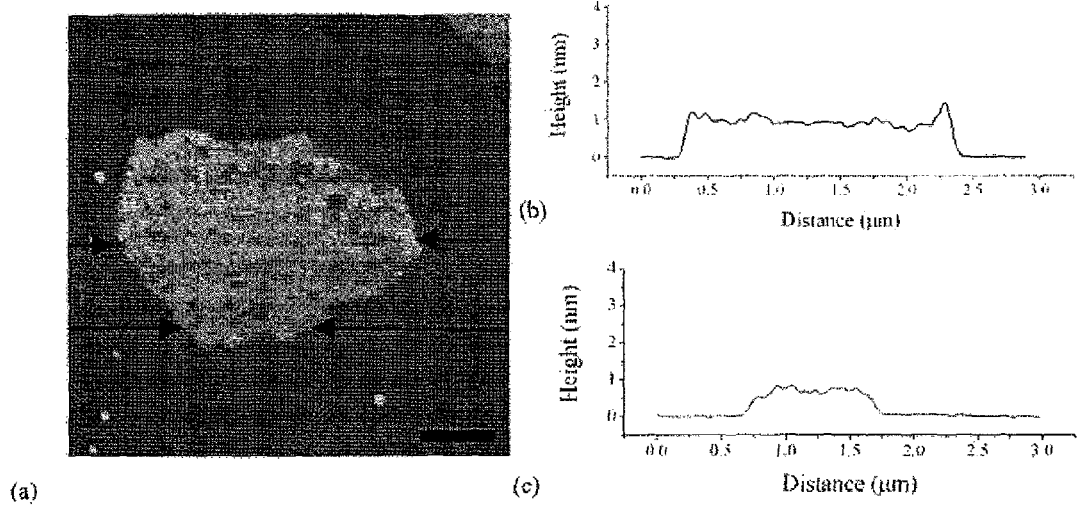

Atomic force microscopy (AFM) is a common technique used to characterise nanostructures. From the AFM image of the purified material shown in FIG. 13a, we observe sheet like structures 2-3 microns in size. Sectional analysis of the graphene particle shown in FIGS. 13b and c demonstrates that it is flat and, in this case, has a height between 0.8 and 1 nm, indicating that up to 3 layers could be present in this particular particle.

Conductivity measurements can give a good idea as to the nature of the material produced. Carbon black and graphene oxide have very low conductivities the former can vary between $10^{-6}$ and $10^{-8}$ S $m^{-1}$ with the latter effectively an insulator. The bulk conductivity of the solid graphene produced here, loosely packed into a film by vacuum filtration of a graphene dispersion in ethanol, was measured to be 0.03 S $m^{-1}$, demonstrating a much higher conductivity in line with that expected for graphene. For comparison, the in-plane conductivity of graphite is in the region of $10^3$ S $m^{-1}$.

Figure 14:
FIG. 14 shows an SEM image of the surface of a mechanically-damaged graphene film obtained using the process of the present invention.

The films produced by the process of the present invention have similar spectroscopic properties to the graphene powder. An SEM image of a deliberately mechanically-damaged film, approximately 300 nm thick grown on a quartz surface, is shown in FIG. 14.

Figure 15:
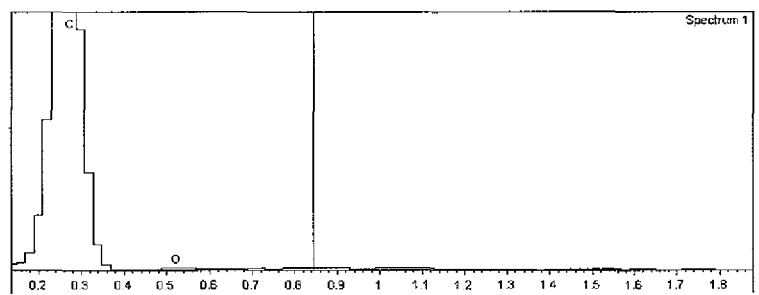
FIG. 15 shows an EDX spectrum of a region of the graphene film shown in FIG. 14.

EDX spectroscopy shows that the graphene film is made up of predominately carbon. An EDX spectrum of a region of a graphene film obtained by the process of the present invention is shown in FIG. 15.

Figure 16:
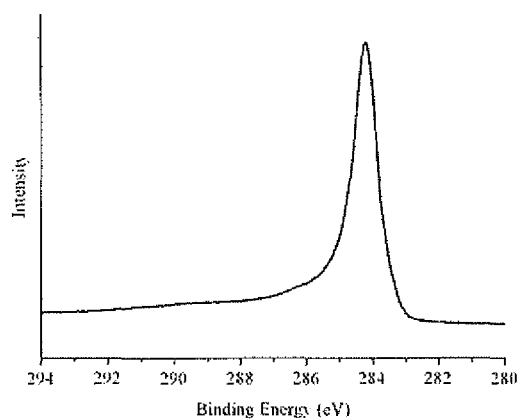
FIG. 16 shows an XPS scan of the graphene film shown in FIG. 14, for the C 1s region.

FIG. 16 shows an XPS spectrum for the graphene film, showing the characteristic C 1s peak for graphitic carbon at 284.6 eV. As with the graphene powder described above, graphene oxide or highly disordered graphene is ruled out as there are no significant shoulders (characteristic of C—O or C=O groups) present on the graphitic C is peak at 284.6 eV.

The sheet resistance of the graphene film was measured, using a 4-point probe in the van der Paaw geometry, to be on average 22.6 k$\Omega\square^{-1}$, which is in line with other reported values for graphene films.

At present, it is hypothesised that the ethanol in the above example acts mainly as a carrier for the sodium ethoxide. Metal alkoxides are solids having a low vapour pressure, so it is difficult to obtain sufficient metal alkoxide vapour to produce useful quantities of graphene by thermal decomposition of a pure metal alkoxide vapour. An advantage of the present invention is therefore that, by using a solution of a metal alkoxide, it is possible to introduce relatively large amounts of the alkoxide into the reaction zone, to obtain a relatively high yield and production rate of graphene.

However, in addition to the ethanol acting as a carrier, it is likely that the sodium carbonate ($Na_2CO_3$) and sodium hydroxide (NaOH) by-products, from the thermal decomposition of sodium ethoxide ($NaOCH_2CH_3$), react with the ethanol ($CH_3CH_2OH$) stream/mist in the hot zone to regenerate sodium ethoxide as:

$Na_2CO_3 + 2CH_3CH_2OH \Rightarrow 2NaOCH_2CH_3 + CO_2 + H_2O$ and $NaOH + CH_3CH_2OH \Rightarrow NaOCH_2CH_3 + H_2O$.

Therefore, the yield of graphene is likely to depend on the presence of ethanol as well as sodium ethoxide ($NaOCH_2CH_3$).

The process described above is generally a chemical vapour deposition (CVD) process. However, the process according to the present invention has several advantages over the chemical vapour deposition (CVD) methods previously used to produce graphene, which involved using CVD to react methane and hydrogen on a transition metal catalyst. The present invention does not require any transition metal catalyst, thereby reducing the cost of production of graphene, and avoiding the difficulties of removing the catalyst from the product. Furthermore, the present invention provides a process by which graphene films can be grown directly onto any desired substrate, for example, a substrate such as silicon, silicon oxide, or silicon carbide, and thereby bypasses the step of transferring a film from a metal catalyst to the required substrate. Furthermore, no other carbon structures are formed in the present invention, unlike in transition metal catalysed CVD where similar conditions can be used to make carbon nanotubes. Also, in the present invention, the non-carbon byproducts are water-soluble, easy to remove and can be recycled to make more sodium ethoxide.

Although the example described above used sodium ethoxide in ethanol, the process can be carried out using any metal alkoxide (for example, MOR, where the metal M is one of sodium (Na), potassium (K), or lithium (Li), or $M_2(OR)_2$ where the metal M is magnesium (Mg), and where R is any alkyl group such as methyl, ethyl, propyl, butyl or longer chains and variations thereof). Similarly, any alcohol (R'—OH) may be used. Preferably, the alkyl group (R) of the alkoxide and the alkyl group (R') of the alcohol in which it is dissolved are the same, as in the example of sodium ethoxide/ethanol described above. However, it is not essential that the alcohol matches the alkoxide. Moreover, although the solvent is preferably an alcohol, other solvents may be used, in particular polar solvents, provided that the alkoxide does not react with the solvent.

Various methods may be used to produce the metal alkoxide solution, and the metal alkoxide or its solution may be bought off-the-shelf. For example, a metal alkoxide may be obtained by any of the following methods: addition of a metal to an alcohol, addition of a metal hydroxide to an alcohol, or addition of a metal carbonate to an alcohol. In each case, the metal alkoxide may be dissolved in alcohol to produce the solution. In the case of addition of the metal to an alcohol, the metal alkoxide may be produced as a solution in the alcohol and need not be isolated. Alternatively, commercially available metal alkoxide or metal alkoxide solution may be used. The metal alkoxide does not need to be treated by any special process.

As mentioned above, the spraying of the metal alkoxide solution into the furnace tube can continue for as long as the metal alkoxide solution is available. The process according to the present invention can therefore be implemented as a continuous process, by providing a continuous supply of metal alkoxide solution to the sprayer. Graphene films may be produced on substrates in a batch process, or by moving substrates through the hot zone of the furnace in a conveyor-belt fashion, in order to deposit graphene films on large numbers of substrates in a substantially continuous manner.

The rate of production of graphene may be controlled by controlling the concentration of the metal alkoxide solution and/or the flow rate of the gas. Higher concentrations of the metal alkoxide solution give a higher rate of production of graphene. The amount of material entering the hot zone can also be controlled by the rate of spraying which can be varied by controlling the flow rate of gas through the spray unit. The gas flow may be controlled by electronic mass flow controllers, but simple valves and bubble meters could also be used. The temperature of the furnace can also be varied to any temperature above the decomposition point of the metal alkoxide.

In the embodiment described above, an inert gas is continuously flowed through the furnace tube 12 during the formation of graphene In the apparatus described above, a simple sprayer was used. However, persons skilled in the art will appreciate that various spraying devices could be used. In particular, various spraying devices may be used, including but not limited to liquid injection, syringe pump devices, atomizers, nebulizers and ultrasonic nebulizers. Droplets of various sizes may be produced. Furthermore, the solution could be sprayed directly into an evacuated hot zone, rather than using a carrier gas to transport the droplets through the hot zone. The rapidly-heated droplets may be vaporised prior to thermal decomposition, although thermal decomposition may occur directly from the liquid phase.

The apparatus described above uses a furnace tube but any vessel or chamber that can be heated and where droplets of metal alkoxide in solution can be introduced could be used. The heated furnace tube, vessel or chamber can be any size. The collection vessel or chamber could involve a filter where the solid powder collects and the gas passes through. In the apparatus described above, the heated furnace tube is shown as horizontal. However, a furnace tube could also be used vertically and metal alkoxide solutions added from the top as a flowing liquid or as droplets or a vapour. In the vertical setup, the graphene powder produced can simply be collected from the bottom, after settling into a collecting chamber of any dimensions, and the gas recycled.

Figure 17:
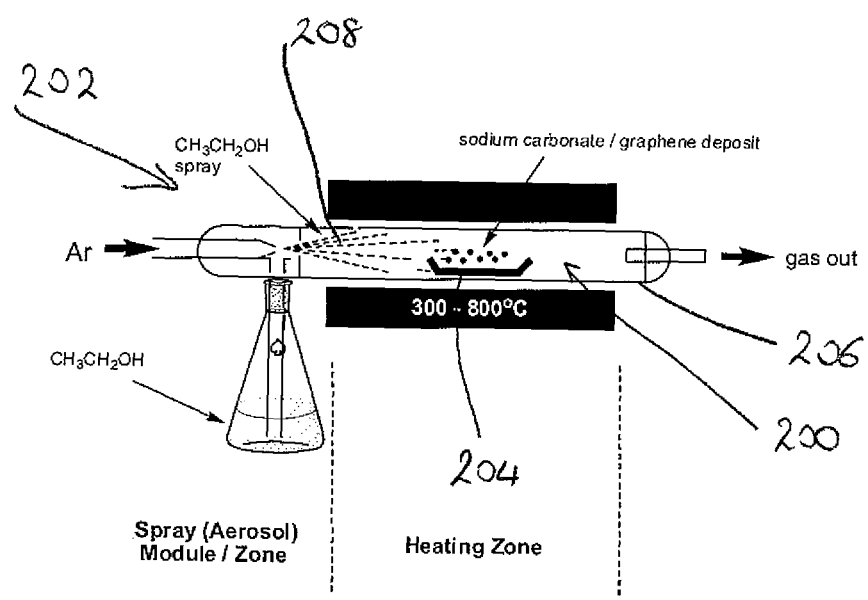
FIG. 17 illustrates a method for producing graphene according to a second embodiment of the present invention.

FIG. 17 illustrates a method for producing graphene according to a second embodiment of the present invention. This method is similar to the method of the first embodiment, in that a metal alkoxide is thermally decomposed to produce graphene in a hot region 200 of a decomposition apparatus 202. However, in the second embodiment, the metal alkoxide is produced in situ, in the hot region 200. A first reagent, in the form of sodium carbonate, is provided in a boat 204 in a hot region 200 of a furnace tube 206. A second reagent 208, in the form of ethanol, is introduced into the hot region 200 by spraying. The ethanol reacts with the sodium carbonate to produce a metal alkoxide, in the form of sodium ethoxide, which thermally decomposes to produce graphene, in the form of graphene powder which collects in the boat 204.

The boat 204 is removed to collect the graphene, and another boat of the first reagent is introduced to the furnace tube 206, so that the production of graphene may continue substantially continuously.

The furnace tube 206 used in the second embodiment may be the same as that used in the first embodiment, and is described above. The heating rate is exactly as before apart from the final temperature is now 800 degrees Celsius in order to be below 851 degrees Celsius, the decomposition point of the sodium carbonate. The flow of ethanol and argon is also the same. Heating up to 800 degrees Celsius is carried out with an argon flow rate of 70 ml/min which is increased to 170 when the required temperature is reached, which sprays the ethanol into the furnace. The sodium carbonate (typically 1.5 g, but this varies according to the size of the boat 204 used) is placed in a boat 204 in the middle of the furnace 206 and the ethanol spray 208 which is vaporized at these temperatures simply passes over the top of the carbonate which produces the sodium ethoxide which immediately decomposes to graphene plus sodium carbonate and sodium hydroxide.

The graphene powder collected may be purified as described in Step 4 of the first embodiment.

Although the method according to the second embodiment has been described with sodium carbonate and ethanol as the first and second reagents respectively, other reagents may be used. For example, other metal carbonates, and/or other alcohols may be used. Examples of other metal alkoxides which can be used are given in the description of the first embodiment above.

The production of graphene continues for as long as the first and second reagents are available. As described above, the thermal decomposition of the metal alkoxide produces the carbonate and hydroxide of the metal as byproducts. These byproducts may in turn react with the first reagent to produce graphene. The first and second reagents may be continuously or intermittently replenished in order to operate the process substantially continuously. For example, in order to carry out the process on a commercial scale, a vertical tube furnace can be used, and the sodium carbonate simply dropped through it whilst spraying ethanol. The graphene would then just simply be collected at the bottom.

It will be appreciated by persons skilled in the art that the above embodiments have been described by way of example only, and not in any limitative sense, and that various alterations and modifications are possible without departure from the scope of the invention as defined by the appended claims.

The invention claimed is:

1. A process for producing graphene, comprising the step of:
   introducing a solution of a metal alkoxide in a solvent into a decomposition apparatus, wherein the step of introducing the solution includes creating droplets comprising a spray or mist or aerosol of the metal alkoxide solution, the decomposition apparatus includes a first region having a sufficiently high temperature to cause thermal decomposition of the metal alkoxide, to produce graphene, and wherein the droplets are created in, or introduced to, a flow of gas.

2. A process according to claim 1, wherein the solvent comprises an alcohol.

3. A process according to claim 2, wherein the alkyl group of the alcohol is the same as the alkyl group of the metal alkoxide.

4. A process according to claim 3 wherein the alcohol comprises ethanol, and the metal alkoxide comprises a metal ethoxide.

5. A process according to claim 1, wherein the metal alkoxide comprises a sodium alkoxide.

6. A process according to claim 1, further comprising the step of vaporising the solution.

7. A process according to claim 1, wherein the gas is inert.

8. A process according to claim 1, comprising the step of flowing the gas through the first region.

9. A process according to claim 1, further comprising the step of flowing the gas through a second region, cooler than the first region, for collecting graphene.

10. A process according to claim 1, wherein graphene powder is produced.

11. A process according to claim 1, wherein the first region is held at a temperature above the decomposition point temperature of the metal alkoxide.

12. A process according to claim 1, wherein the first region is held at a temperature in the range 300 to 1800 degrees Celsius.

13. A process according to claim 1, wherein the process includes a chemical vapour deposition process.

14. A process according to claim 1, wherein the process is operated substantially continuously.

15. A process according to claim 1, further comprising the step of washing the graphene with water to remove other products of the thermal decomposition step.

16. A process according to claim 1, wherein the metal alkoxide is obtained by a method other than a solvothermal process.

17. A process according to claim 1, wherein the metal alkoxide solution is obtained using at least one of the following steps:
   adding the metal to an alcohol;
   adding a metal hydroxide to an alcohol; and/or
   adding a metal carbonate to an alcohol.

18. A process according to claim 1, further comprising the step of annealing the graphene.

19. A process according to claim 18, wherein the step of annealing the graphene is performed at a temperature between 400 and 3000 degrees Celsius.

20. A process according to claim 1, comprising the step of growing a film of graphene on a substrate.

21. A process according to claim 20, wherein the substrate comprises at least one of: silicon, silicon oxide, glass and/or silicon carbide.

22. A process according to claim 20, comprising the step of controlling the thickness of the graphene film.

23. A process according to claim 20, comprising the step of controlling the duration of growth of the film.

24. A process for producing graphene, comprising the step of:
   introducing at least a first reagent and a second reagent into a first region of a decomposition apparatus,
   wherein said second reagent is introduced as droplets comprising a mist, spray or aerosol into the decomposition apparatus;
   wherein said first and second reagents react to produce a metal alkoxide;

said first region has a sufficiently high temperature to cause thermal decomposition of the metal alkoxide to produce graphene; and wherein the droplets are created in, or introduced to, a flow of gas.

25. A process according to claim 24, wherein said first and/or second reagent is replenished intermittently.

26. A process according to claim 24, comprising the step of flowing a gas through the first region.

27. A process according to claim 24, wherein the gas is inert.

28. A process according to claim 24, wherein the first reagent is held in a boat.

29. A process according to claim 24, wherein graphene powder is produced.

30. A process according to claim 24, wherein the first region is held at a temperature in the range 300 to 1800 degrees Celsius.

31. A process according to claim 24, wherein the process is operated substantially continuously.

32. A process according to claim 24, further comprising the step of washing the graphene with water to remove other products of the thermal decomposition step.

33. A process according to claim 24, further comprising the step of annealing the graphene.

34. A process according to claim 33, wherein the step of annealing the graphene is performed at a temperature between 400 and 3000 degrees Celsius.

35. A process according to claim 24, wherein
said first reagent comprises at least one of: a metal, a metal carbonate, and/or a metal hydroxide; and
said second reagent comprises an alcohol.

36. A process according to claim 35, wherein said metal is sodium.

37. A process according to claim 35, wherein said alcohol is ethanol.

* * * * *

UNITED STATES PATENT AND TRADEMARK OFFICE
CERTIFICATE OF CORRECTION

PATENT NO.        : 9,932,227 B2
APPLICATION NO.   : 13/384881
DATED             : April 3, 2018
INVENTOR(S)       : Karl Stuart Coleman It is certified that error appears in the above-identified patent and that said Letters Patent is hereby corrected as shown below:

In the Specification

Column 9, Line 25, "of M" should be --of 5 M--.

Signed and Sealed this
Nineteenth Day of June, 2018

Andrei Iancu
*Director of the United States Patent and Trademark Office*